(12) United States Patent
Barsoum et al.

(10) Patent No.: US 8,645,446 B2
(45) Date of Patent: Feb. 4, 2014

(54) MULTI-INPUT IIR FILTER WITH ERROR FEEDBACK

(75) Inventors: Maged F. Barsoum, Saratoga, CA (US); Jinwen Xi, Sunnyvale, CA (US); Dariush Dabiri, San Jose, CA (US)

(73) Assignee: Applied Micro Circuits Corporation, Sunnyvale, CA (US)

( * ) Notice: Subject to any disclaimer, the term of this patent is extended or adjusted under 35 U.S.C. 154(b) by 582 days.

(21) Appl. No.: 12/952,193

(22) Filed: Nov. 22, 2010

(65) Prior Publication Data

US 2012/0131080 A1   May 24, 2012

(51) Int. Cl.
*G06F 17/10* (2006.01)

(52) U.S. Cl.
USPC .......................................... 708/322; 708/300

(58) Field of Classification Search
None
See application file for complete search history.

(56) References Cited

U.S. PATENT DOCUMENTS

| | | | |
|---|---|---|---|
| 7,386,049 B2 * | 6/2008 | Garrido et al. | 375/240.15 |
| 7,388,908 B2 * | 6/2008 | Dowling | 375/229 |
| 7,570,182 B2 * | 8/2009 | Sheba et al. | 341/118 |
| 2012/0014416 A1 * | 1/2012 | Dabiri | 375/144 |

* cited by examiner

*Primary Examiner* — Michael D Yaary
(74) *Attorney, Agent, or Firm* — Turocy & Watson, LLP

(57) ABSTRACT

Methods and systems for multi-input IIR filters with error feedback are disclosed. By using multiple-inputs to generate multiple outputs during each iteration, a multi-input IIR filter in accordance with the present invention has greatly increased throughput. Furthermore, the addition of a multi-variable error feedback unit in accordance with the present invention in a multiple-input IIR filter can greatly increase the accuracy of the multi-variable IIR Filter.

13 Claims, 8 Drawing Sheets

MULTI-INPUT IIR FILTER WITH ERROR FEEDBACK

CROSS-REFERENCE TO RELATED APPLICATIONS

This patent application is related to and incorporates by reference herein in their entirety, the following patent applications that are co-owned and concurrently filed herewith:

(1) U.S. patent application Ser. No. 12/952,154, entitled "Stabilized Digital Quadrature Oscillator" by Dariush Dabiri et al.;

(2) U.S. patent application Ser. No. 12/952,164, entitled "Detection and Estimation of Narrowband Interference By Matrix Multiplication" by Dariush Dabiri;

(3) U.S. patent application Ser. No. 12/952,172, entitled "Confirmation of Presence of Narrowband Interference By Harmonic Analysis" by Dariush Dabiri et al.;

(4) U.S. patent application Ser. No. 12/952,178, entitled "Adaptive Spectral Enhancement and Harmonic Separation" by Dariush Dabiri et al.;

(5) U.S. patent application Ser. No. 12/952,184, entitled "Adaptive Narrowband Interference Prediction Circuit and Method" by Dariush Dabiri et al.; and (6) U.S. patent application Ser. No. 12/952,150, entitled "Narrowband Interference Cancellation Method and Circuit" by Dariush Dabiri.

BACKGROUND

1. Field

The present invention relates to digital filters for signal and image processing.

2. Relevant Background

IIR (Infinite Impulse Response) filters are used for many signal and image processing applications. For example, IIR filters are frequently used to process signals in computer networks, communication systems (both wired and wireless), as well as imaging systems. Specifically, IIR filters can be used to improve signal quality in noise (such as electro magnetic interference) cancellation systems.

FIG. 1 is a block diagram of an IIR filter 100 having a multiplier 110, an adder 120, a quantizer 130, a delay unit 140, and a multiplier 150. IIR filter 100 receives an input signal I and generates an output signal O. The behavior of IIR filter 100 is controlled by an input factor IF and a feedback factor FF. Delay unit 140 and multiplier 150 form a feedback path for IIR filter 100.

Specifically, multiplier 110 multiplies input signal I with input factor IF. The product from multiplier 110 is provided to one input port of adder 120. Adder 120 also receives the product from multiplier 150. The sum from adder 120 is quantized by quantizer 130 to form output signal O. Output signal O is sent through the feedback path formed by delay unit 140 and multiplier 150. Specifically, output signal O is delayed by one clock cycle in delay unit 140. The delayed output from delay unit 140 is multiplied by feedback factor FF by multiplier 150. The product from multiplier 150 is provided to adder 120.

In many applications, signal rates are increasing very rapidly. For example, network bandwidth has increased by several orders of magnitude in the past few years. The increasing signal rates require faster and faster IIR filters to maintain signal quality. However, hardware implementations of IIR filters are not able to perform at the required speed of the signals. Hence there is a need for a method and system for performing the functions of an IIR filter more rapidly.

SUMMARY

Conventional IIR filters are not able to satisfy the speed requirements of modern signal processing. The present invention provides a multiple-input IIR filter that can support signal speeds several times greater than conventional IIR filters. Furthermore, the present invention includes a multi-variable error feedback unit that improves the accuracy of the multi-input IIR filter.

In accordance with the present invention multiple values of the input signal are filtered simultaneously to produce multiple output values. Multiple feedback values are produced simultaneously to maintain the filtering process. Furthermore, multiple error feedback values are generated simultaneously to maintain accuracy. In a specific embodiment of the present invention, a primary input combination unit receives a plurality of input values and generates a first combined input value and a second combined input value. An adder adds the first combined input value with a first primary feedback value and a first error feedback value to generate a first output value. Similarly a second adder adds the second combined input value with a second primary feedback value and a second error feedback value to generate a second output value. A pair of quantizers quantizes the first output value and the second output value to generate a first quantized output value and a second quantized output value, respectively. A pair of delay units delay the first quantized output value and the second quantized value to generate a first delayed quantized output value and a second delayed quantized output value, respectively. A multi-variable feedback unit receives the first delayed quantized output value and the second delayed quantized output value and generates the first primary feedback value and the second primary feedback value. A multi-variable error feedback unit receives the first output value, the second output value, the first quantized output value and the second quantized output value and generates the first error feedback value and the second error feedback value.

The present invention will be more fully understood in view of the following description and drawings.

DETAILED DESCRIPTION

Figure 1:
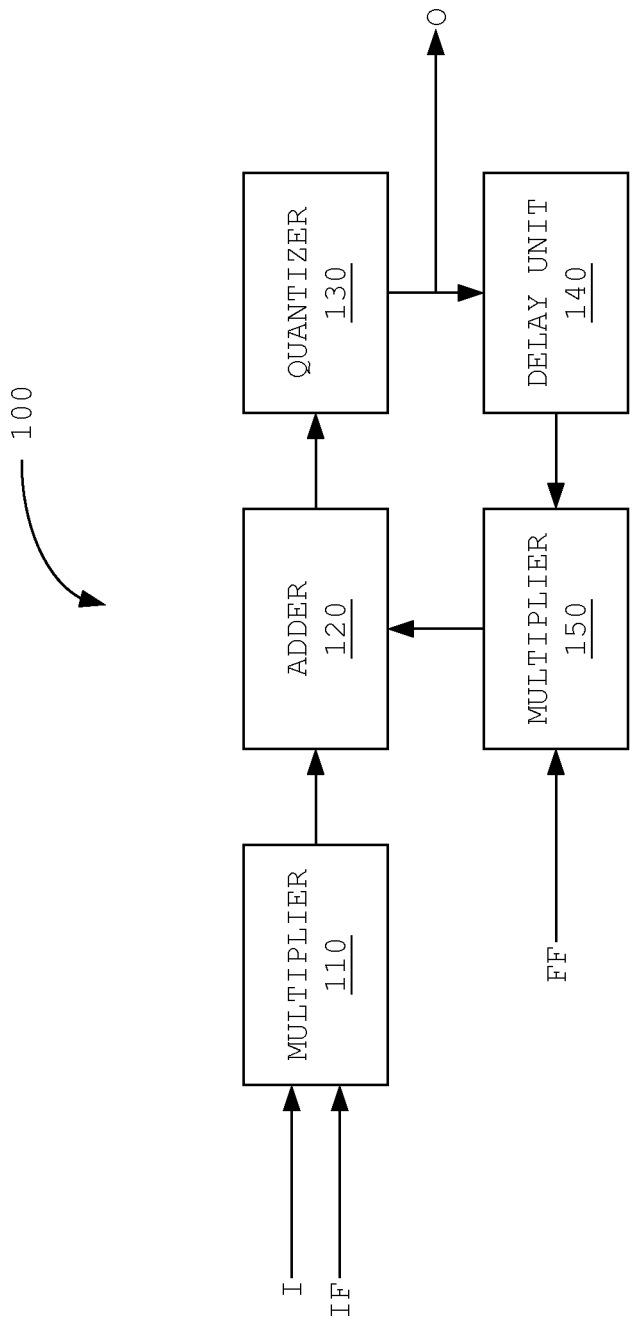
FIG. 1 is a block diagram of a conventional IIR filter.
Figure 2:
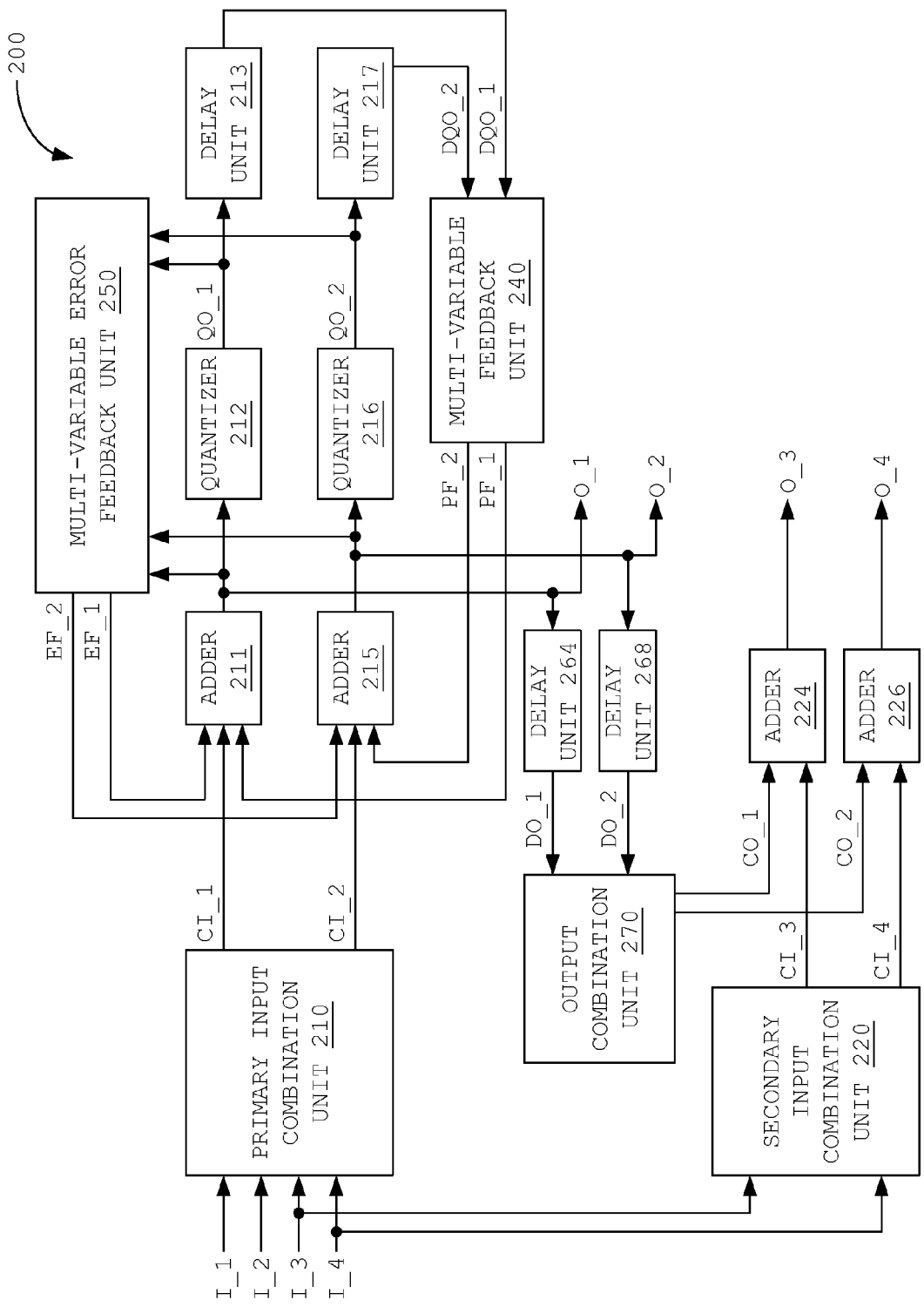
FIG. 2 is a block diagram of a multi-input IIR filter with error feedback in accordance with one embodiment of the present invention.

As explained above, conventional IIR filters may not be adequate for high speed signal processing tasks. However, in accordance with the present invention, a multi-input IIR filter performs IIR filtering on multiple inputs at the same time to achieve much greater throughput than a conventional IIR filter. Furthermore, the accuracy of the multi-input IIR filter can be enhanced by including a multi-variable error feedback unit. FIG. 2 shows a block diagram of a multi-input IIR filter that includes a primary input combination unit 210; a secondary input combination unit 220; a multi-variable feedback unit 240; a multi-variable error feedback unit 250; an output combination unit 270; adders 211, 215, 224, and 226; delay units 213, 217, 264, and 268; and quantizers 212 and 216. Multi-input IIR filter 200 receives an input signal I (not specifically labeled in FIG. 2) and generates an output signal O (not specifically labeled in FIG. 2). Specifically, during each iteration multi-input IIR filter 200 receives four input values $I\_1$, $I\_2$, $I\_3$, and $I\_4$ of input signal I and generates four output values $O\_1$, $O\_2$, $O\_3$, and $O\_4$ of output signal O. In most IIR filters an iteration occurs during each clock cycle. Thus, multi-input IIR filter 200 is four times faster than conventional single input IIR filters.

The feedback paths in IIR filters cause a data dependency between values of input signal I and output signal O. Therefore, parallelizing IIR filters can not be achieved by simply replicating the hardware of a single input IIR filter multiple times because of the increasing of the quantization errors. Various novel techniques are used in accordance with the present invention to account for the data dependencies. For example, in multi-input IIR filter 200, the input values are combined to form combined input values, the output values are combined to form primary feedback factors, combined output values, and error feedback values.

Specifically, as illustrated in FIG. 2, Input values $I\_1$, $I\_2$, $I\_3$, and $I\_4$ are provided to primary input combination unit 210, which generates a first combined input value $CI\_1$ and second combined input value $CI\_2$. Furthermore, input values $I\_3$ and $I\_4$ are provided to secondary input combination unit 220, which generates a third combined input value $CI\_3$ and a fourth combined input value $CI\_4$. Different embodiments of multi-input IIR filter 200 can generate combined input values in different ways. Generally, each of the combined input values is a function of multiple input values. In one embodiment of the present invention, each of the combined input values is a sum of products involving the input values with a set of input combination factors. The specific choices of input combination factors in part determine the behavior of multi-input IIR filter 200. Specific embodiments of primary input combination unit 210 and secondary input combination unit 220 are described in detail below with respect to FIGS. 3 and 4, respectively.

Combined input value $CI\_1$ is provided to adder 211. Adder 211 also receives a primary feedback value $PF\_1$ (from multi-variable feedback unit 240) and an error feedback value $EF\_1$ (from multi-variable error feedback unit 250). Adder 211 adds combined input value $CI\_1$, primary feedback value $PF\_1$ and error feedback value $EF\_1$ to generate first output value $O\_1$. Output value $O\_1$ is provided to quantizer 212, multi-variable error feedback unit 250, and delay unit 264. Quantizer 212 quantizes (i.e. reduces the bit width) of output value $O\_1$ to generate quantized output value $QO\_1$. Quantized output value $QO\_1$ is provided to delay unit 213, which delays quantized output value $QO\_1$ by one iteration (generally one clock cycle) to generate delayed quantized output value $DQO\_1$, which is provided to multi-variable feedback unit 240. In one embodiment of the present invention, quantizers 212 and 216 quantizes to 10 bits of precision.

Similarly, combined input value $CI\_2$ is provided to adder 215. Adder 215 also receives a primary feedback value $PF\_2$ (from multi-variable feedback unit 240) and an error feedback value $EF\_2$ (from multi-variable error feedback unit 250). Adder 215 adds combined input value $CI\_2$, primary feedback value $PF\_2$ and error feedback value $EF\_2$ to generate second output value $O\_2$. Output value $O\_2$ is provided to quantizer 216, multi-variable error feedback unit 250, and delay unit 268. Quantizer 216 quantizes output value $O\_2$ to generate quantized output value $QO\_2$. Quantized output value $QO\_2$ is provided to delay unit 217, which delays quantized output value $QO\_2$ by one iteration to generate delayed quantized output value $DQO\_2$, which is provided to multi-variable feedback unit 240.

Multi-variable feedback unit 240, which receives delayed quantized output values $DQO\_1$ and $DQO\_2$ from delay units 213 and 217 respectively, generates a first primary feedback value $PF\_1$ and a secondary primary feedback value $PF\_2$. Generally, Primary feedback values $PF\_1$ and $PF\_2$ are both functions of both delayed quantized outputs $DQO\_1$ and $DQO\_2$. In one embodiment of the present invention, each of the primary feedback values is a sum of products involving the delay quantized output values with a set of primary feedback factors. The specific choices of primary feedback factors in part determines the behavior of multi-input IIR filter 200. A specific embodiments of multi variable feedback unit 240 is described in detail below with respect to FIG. 5. Primary feedback value $PF\_1$ is provided to adder 211 and primary feedback value $PF\_2$ is provided to adder 215.

Multi-variable error feedback unit 250 compensates for the error introduced by quantizers 212 and 216. Thus, multi-variable error feedback unit 250 receives both output value $O\_1$ and quantized output value $QO\_1$ in order to calculate the error introduced by quantizer 212. Similarly, multi-variable error feedback unit 250 also receives both output value $O\_2$ and quantized output value $QO\_2$ in order to calculate the error introduced by quantizer 216. The error values are combined using a set of error feedback factors to calculate a first error feedback value $EF\_1$ and a second error feedback value $EF\_2$. Furthermore, the calculation of error feedback values $EF\_1$ and $EF\_2$ involves a delay element so that the error feedback values are synchronized with the primary feedback values. Specific embodiments of a multi-variable error feedback unit are described in detail below with respect to FIGS. 6A and 6B.

Output values $O\_1$ and $O\_2$ are also used to generate output values $O\_3$ and $O\_4$ (in the next iteration of the filter). Specifically, output values $O\_1$ is provided to delay unit 264 which generates delayed output value $DO\_1$, which is provided to output combination unit 270. Similarly, output value $O\_2$ is provided to delay unit 268 which generates delayed output value $DO\_2$, which is provided to output combination unit 270.

Output combination unit 270, which receives delayed output value $DO\_1$ and delayed output value $DO\_2$, generates a first combined output value $CO\_1$ and a second combined output value $CO\_2$. Generally, combined output values $CO\_1$ and $CO\_2$ are both functions of both delayed output values $DO\_1$ and $DO\_2$. In one embodiment of the present invention, each of the combined output values is a sum of products involving the delay output values with a set of output combination factors. The specific choices of output combination factors in part determines the behavior of multi-input IIR filter 200. A specific embodiment of output combination unit 270 is described in detail below with respect to FIG. 7. Combined output values CO_1 and CO_2 are provided to adder 224s and 226, respectively.

Adder 224, which receives combined input value CI_3 and combined output value CO_1 calculates output value O_3 as the sum of combined input value CI_3 and combined output value CO_1. Similarly, Adder 226, which receives combined input value CI_4 and combined output value CO_2 calculates output value O_4 as the sum of combined input value CI_4 and combined output value CO_2.

Figure 3:
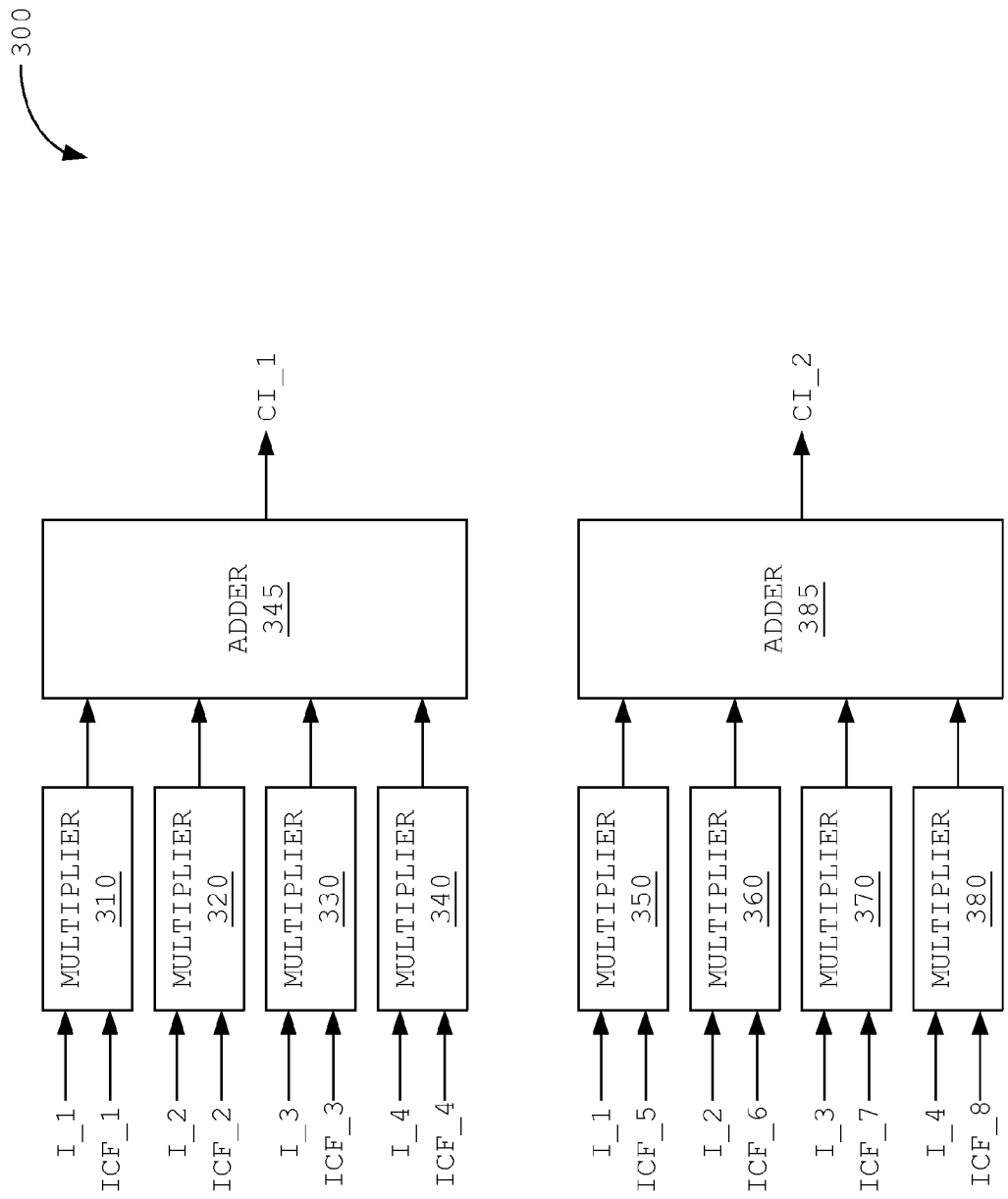
FIG. 3 is block diagram of a primary input combination unit in accordance with one embodiment of the present invention.

FIG. 3 is a block diagram of a primary input combination unit 300, which can be used for primary input combination unit 210 in FIG. 2. Primary input combination unit 300 includes multipliers 310, 320, 330, 340, 350, 360, 370, and 380 and adders 345 and 385. Specifically, multipliers 310, 320, 330, and 340 receive input values I_1, I_2, I_3, and I_4, and input combination factors ICF_1, ICF_2, ICF_3, and ICF_4, respectively. Multiplier 310 calculates the product of input value I_1 and input combination factor ICF_1; multiplier 320 calculates the product of input value I_2 and input combination factor ICF_2; multiplier 330 calculates the product of input value I_3 and input combination factor ICF_3; multiplier 340 calculates the product of input value I_4 and input combination factor ICF_4. The products calculated by multipliers 310, 320, 330, and 340 are provided to adder 345, which calculates combined input value CI_1 as the sum of the products provided by multipliers 310, 320, 330, and 340. Therefore, in the embodiment of FIG. 3, combined input value CI_1 is equal to input value I_1 multiplied by input combination factor ICF_1 plus input value I_2 multiplied by input combination factor ICF_2 plus input value I_3 multiplied by input combination factor ICF_3 plus input value I_4 multiplied by input combination factor ICF_4.

Multipliers 350, 360, 370, and 380 receive input values I_1, I_2, I_3, and I_4, and input combination factors ICF_5, ICF_6, ICF_7, and ICF_8, respectively. Multiplier 350 calculates the product of input value I_1 and input combination factor ICF_5; multiplier 360 calculates the product of input value I_2 and input combination factor ICF_6; multiplier 370 calculates the product of input value I_3 and input combination factor ICF_7; multiplier 380 calculates the product of input value I_4 and input combination factor ICF_8. The products calculated by multipliers 350, 360, 370, and 380 are provided to adder 385, which calculates combined input value CI_2 as the sum of the products provided by multipliers 350, 360, 370, and 380. Therefore, in the embodiment of FIG. 3, combined input value CI_2 is equal to input value I_1 multiplied by input combination factor ICF_5 plus input value I_2 multiplied by input combination factor ICF_6 plus input value I_3 multiplied by input combination factor ICF_7 plus input value I_4 multiplied by input combination factor ICF_8.

Figure 4:
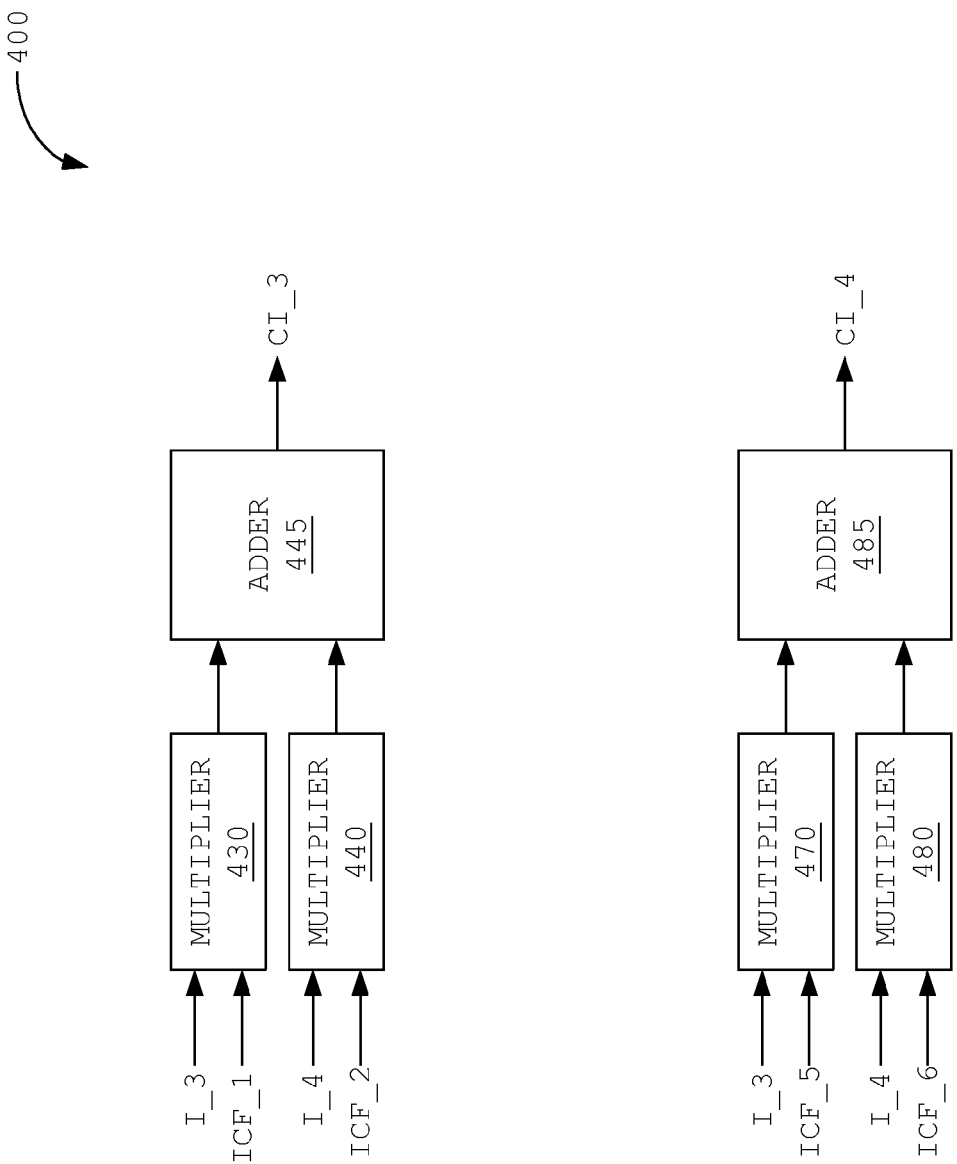
FIG. 4 is block diagram of a secondary input combination unit in accordance with one embodiment of the present invention.

FIG. 4 is a block diagram of a secondary input combination unit 400, which can be used for secondary input combination unit 220 in FIG. 2. In the embodiment of FIG. 4, the input combination factors are a subset of the input combination factors in the primary input combination unit. However, other embodiments of the present invention may use input combination factors in the secondary input combination unit that are different from the input combination factors in the primary input combination unit. Secondary input combination unit 400 includes multipliers 430, 440, 470, and 480 and adders 445 and 485. Specifically, multipliers 430 and 440 receive input values I_3, and I_4, and input combination factors ICF_1 and ICF_2, respectively. Multiplier 430 calculates the product of input value I_3 and input combination factor ICF_1 and multiplier 440 calculates the product of input value I_4 and input combination factor ICF_2. The products calculated by multipliers 430 and 440 are provided to adder 445, which calculates combined input value CI_3 as the sum of the products provided by multipliers 430, and 440. Thus, in the embodiment of FIG. 4, combined input value CI_3 is equal to input value I_3 multiplied by input combination factor ICF_1 plus input value I_4 multiplied by input combination factor ICF_2.

Multipliers 470 and 480 receive input values I_3, and I_4, and input combination factors ICF_5, and ICF_6, respectively. Multiplier 480 calculates the product of input value I_3 and input combination factor ICF_5 and multiplier 440 calculates the product of input value I_4 and input combination factor ICF_6. The products calculated by multipliers 470 and 480 are provided to adder 485, which calculates combined input value CI_4 as the sum of the products provided by multipliers 470, and 480. Thus, in the embodiment of FIG. 4, combined input value CI_4 is equal to input value I_3 multiplied by input combination factor ICF_5 plus input value I_4 multiplied by input combination factor ICF_6.

Figure 5:
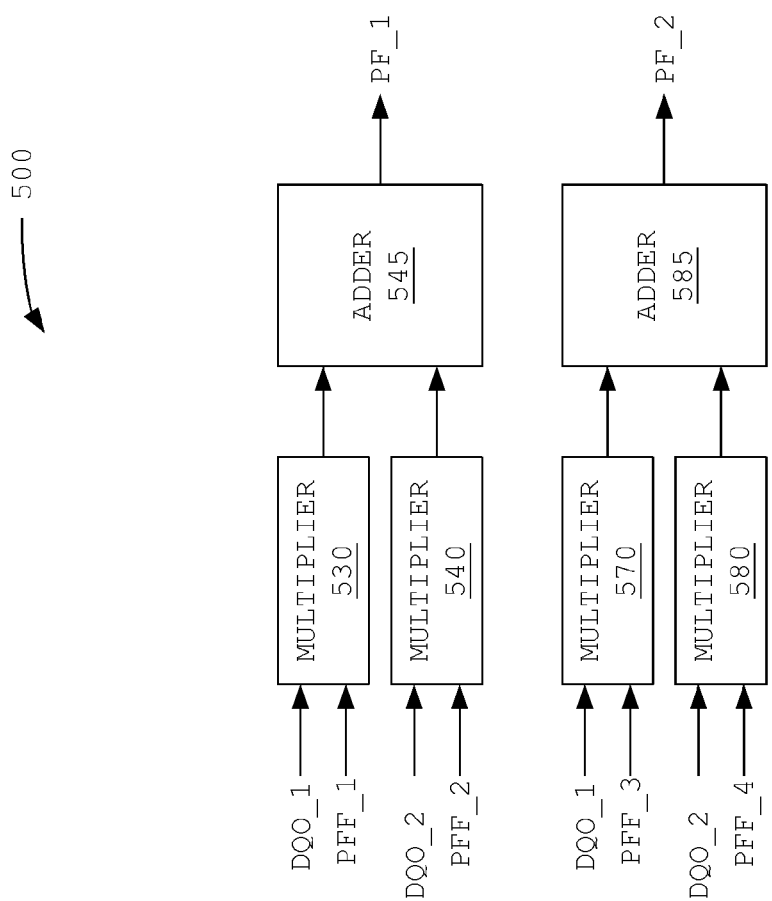
FIG. 5 is a flow diagram for a multi-variable feedback unit in accordance with one embodiment of the present invention.

FIG. 5 is a block diagram of a multi-variable feedback unit 500, which can be used for multi-variable feedback unit 240 in FIG. 2. Multi-variable feedback unit 500 includes multipliers 530, 540, 570, and 580 and adders 545 and 585. Specifically, multipliers 530 and 540 receive delayed quantized output value DQO_1 and DQO2, and primary feedback factors PFF_1 and PFF_2, respectively. Multiplier 530 calculates the product of delayed quantized output value DQO_1 and primary feedback factors PFF_1. Multiplier 540 calculates the product of delayed quantized output value DQO_2 and primary feedback factors PFF_2. The products calculated by multipliers 530 and 540 are provided to adder 545, which calculates primary feedback value PF_1 as the sum of the products provided by multipliers 530, and 540. Thus for the embodiment of FIG. 5, primary feedback value PF_1 is equal to delayed quantized output value DQO_1 multiplied by primary feedback factor PFF_1 plus delayed quantized output value DQO_2 multiplied by primary feedback factor PFF_2.

Multipliers 570 and 580 receive delayed quantized output value DQO_1 and DQO2, and primary feedback factors PFF_3 and PFF_4, respectively. Multiplier 570 calculates the product of delayed quantized output value DQO_1 and primary feedback factors PFF_3. Multiplier 540 calculates the product of delayed quantized output value DQO_2 and primary feedback factors PFF_4. The products calculated by multipliers 570 and 580 are provided to adder 585, which calculates primary feedback value PF_2 as the sum of the products provided by multipliers 570, and 580. Thus for the embodiment of FIG. 5, primary feedback value PF_2 is equal to delayed quantized output value DQO_1 multiplied by primary feedback factor PFF_3 plus delayed quantized output value DQO_2 multiplied by primary feedback factor PFF_4.

Figure 6A:
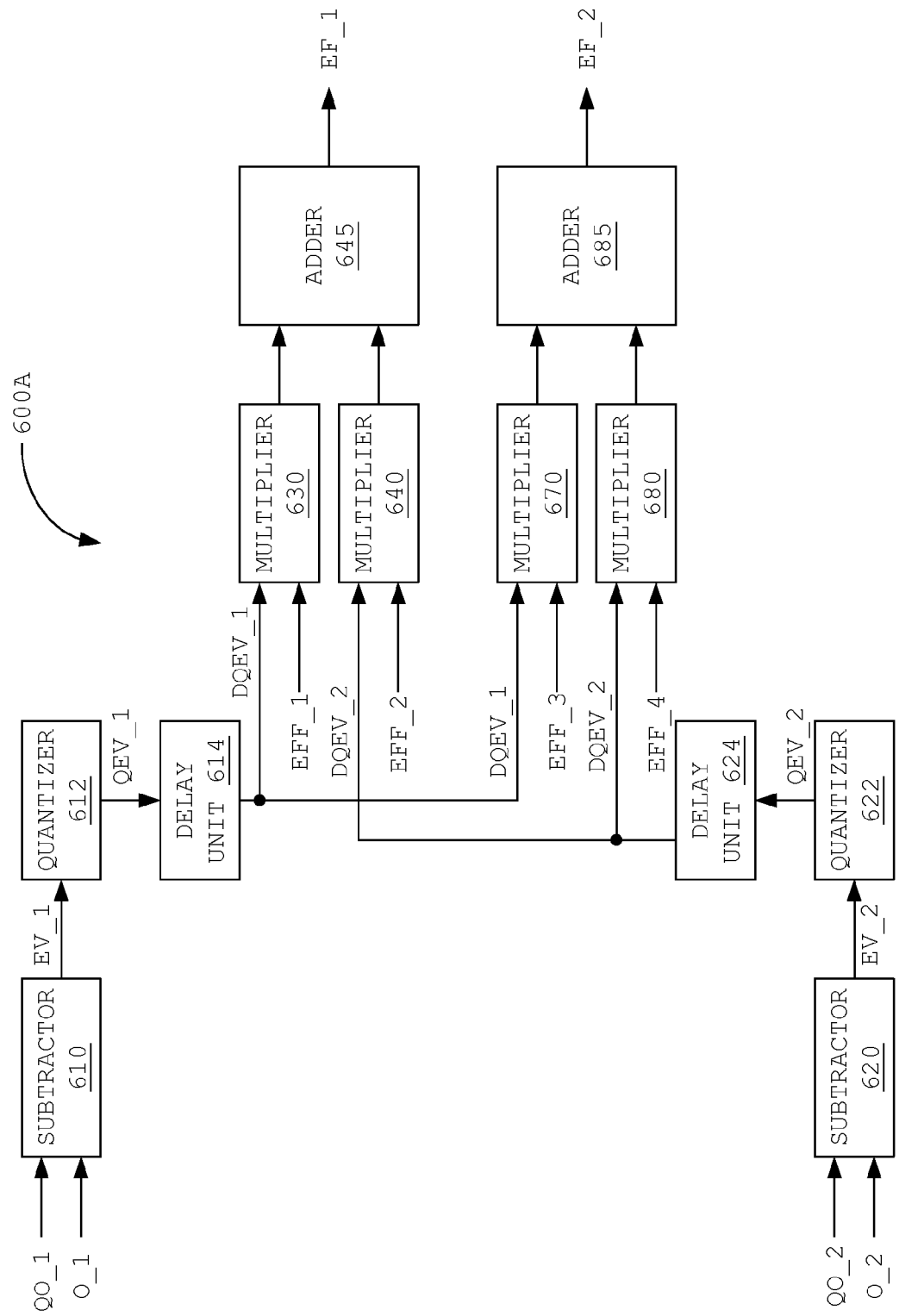
FIG. 6A is a block diagram of a multi-variable error feedback unit in accordance with one embodiment of the present invention.

FIG. 6A is a block diagram of a multi-variable error feedback unit 600A, which can be used for multi-variable error feedback unit 250 in FIG. 2. Multi-variable error feedback unit 600 includes subtractors 610 and 620; quantizers 612 and 622; delay units 614 and 624; multipliers 630, 640, 670, and 680 and adders 645 and 685. Subtractor 610, which receives output value O_1 and quantized output value QO_1, generates a first error value EV_1, which is equal to output value O_1 minus quantized output value QO_1. Error value EV_1 is provided to quantizer 612, which generates a quantized error value QEV_1, which is provided to delay unit 614. Delay unit 614 generates delayed quantized error value DQEV_1. Similarly, Subtractor 620, which receives output value O_2 and quantized output value QO_2, generates a second error value EV_2, which is equal to output value O_2 minus quantized output value QO_2. Error value EV_2 is provided to quantizer 622, which generates a quantized error value QEV_2, which is provided to delay unit 624. Delay unit 624 generates delayed quantized error value DQEV_2.

Delayed quantized error values DQEV_1 and DQEV_2 are then combined to generate error feedback values EF_1 and EF_2. Specifically, multipliers 630 and 640 receive delayed quantized error values DQEV_1 and DQEV_2, and error feedback factors EFF_1 and EFF_2, respectively. Multiplier 630 calculates the product of delayed quantized error value DQEV_1 and error feedback factors EFF_1. Multiplier 640 calculates the product of delayed quantized error value DQEV_2 and error feedback factors EFF_2. The products calculated by multipliers 630 and 640 are provided to adder 645, which calculates error feedback value EF_1 as the sum of the products provided by multipliers 630, and 640. Thus in the embodiment of FIG. 6A, error feedback value EF_1 is equal to delayed quantized error value DQEV_1 multiplied by error feedback factor EFF_1 plus delayed quantized error value DQEV_2 multiplied by error feedback factor EFF_2.

Multipliers 670 and 680 receive delayed quantized error values DQEV_1 and DQEV_2, and error feedback factors EFF_3 and EFF_4, respectively. Multiplier 670 calculates the product of delayed quantized error value DQEV_1 and error feedback factors EFF_3. Multiplier 680 calculates the product of delayed quantized error value DQEV_2 and error feedback factors EFF_4. The products calculated by multipliers 670 and 680 are provided to adder 685, which calculates error feedback value EF_2 as the sum of the products provided by multipliers 670, and 680. Thus in the embodiment of FIG. 6A, error feedback value EF_2 is equal to delayed quantized error value DQEV_1 multiplied by error feedback factor EFF_3 plus delayed quantized error value DQEV_2 multiplied by error feedback factor EFF_4.

In most embodiments of the present invention, error feedback factors EFF_1, EFF_2, EFF_3, and EFF_4 are quantized versions of primary feedback factors PFF_1, PFF_2, PFF_3, and PFF_4, respectively. For example, in a particular embodiment of the present invention, primary feedback factors have 25 bit precision while error feedback factors have 14 bit precision. However, some embodiments of the present invention have independent error feedback factors and primary feedback factors.

Figure 6B:
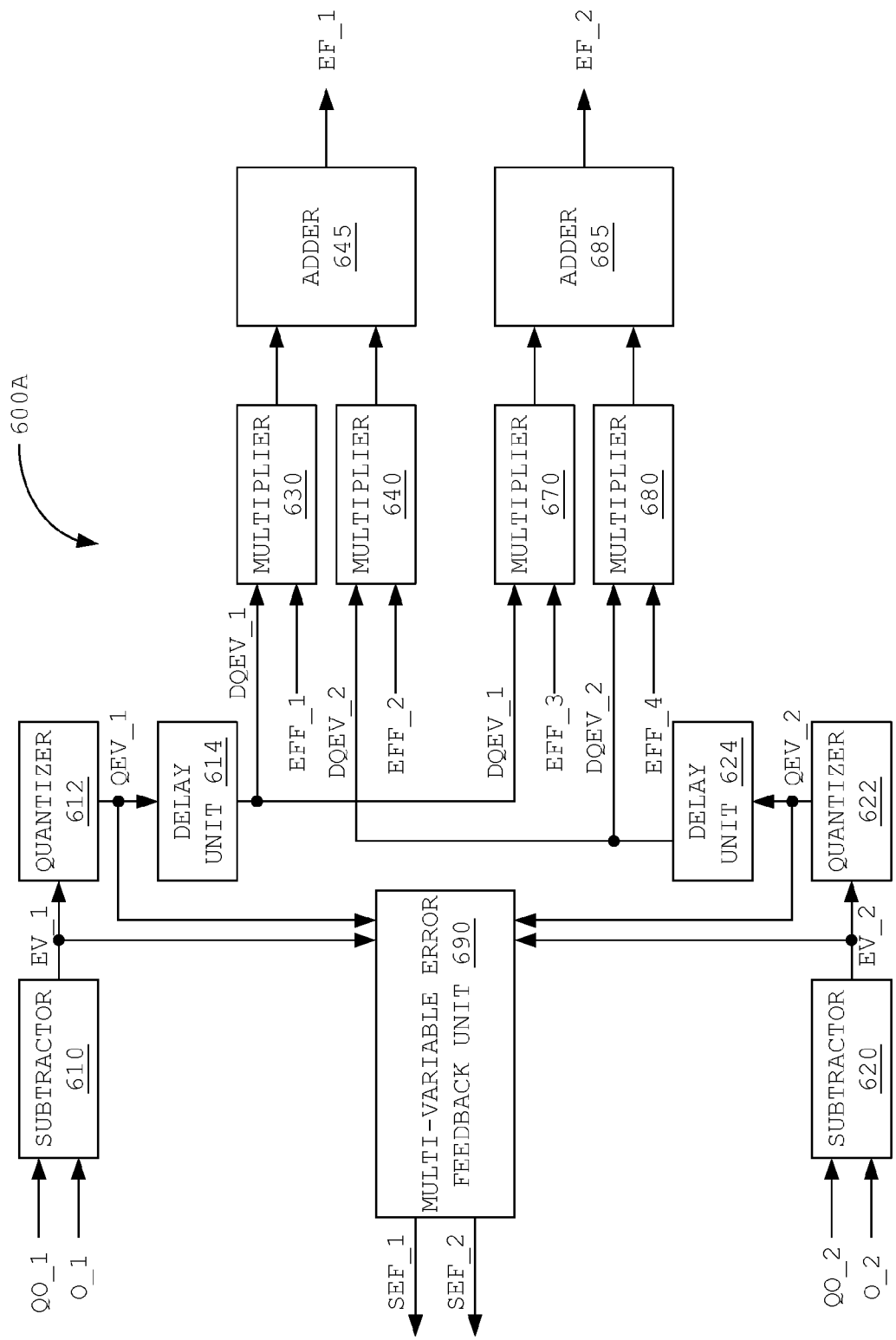
FIG. 6B is a block diagram of a multi-variable error feedback unit in accordance with another embodiment of the present invention.

FIG. 6B is a block diagram of a multi-variable error feedback unit 600B, which can be used for multi-variable error feedback unit 250 in FIG. 2 (with some small modifications as described below). The embodiment in FIG. 6B is very similar to the embodiment of FIG. 6A. Therefore, for conciseness only the differences are described. Specifically, the embodiment of FIG. 6B includes a secondary multi-variable error feedback unit 690 to compensate for the error caused by quantizers 612 and 622 in the same way that multi-variable error feedback unit 250 compensates for the error caused by quantizers 212 and 216 in FIG. 2.

In particular, multi-variable error feedback unit 690 receives both error value EV_1 and quantized error value QEV_1 in order to calculate the error introduced by quantizer 612. Similarly, multi-variable error feedback unit 690 also receives both error value EV_2 and quantized error value QEV_2 in order to calculate the error introduced by quantizer 622. The error values caused by quantizer 612 and 622 are combined using secondary error feedback factors to calculate a first secondary error feedback value SEF_1 and a second secondary error feedback value SEF_2. Furthermore, the calculation of secondary error feedback values SEF_1 and SEF_2 involves a delay element so that the secondary error feedback values are synchronized with the error feedback values. The multi-variable error feedback unit shown in FIG. 6A can be used for multi variable error feedback unit 690. Multi variable error feedback unit 600B can be used with multi-input IIR filter 200 (FIG. 2) by modifying adder 211 to include secondary error feedback value SEF_1 in the calculation of output value O_1. In addition, adder 215 should be modified to include secondary error feedback value SEF_2 in the calculation of output value O_2.

Figure 7:
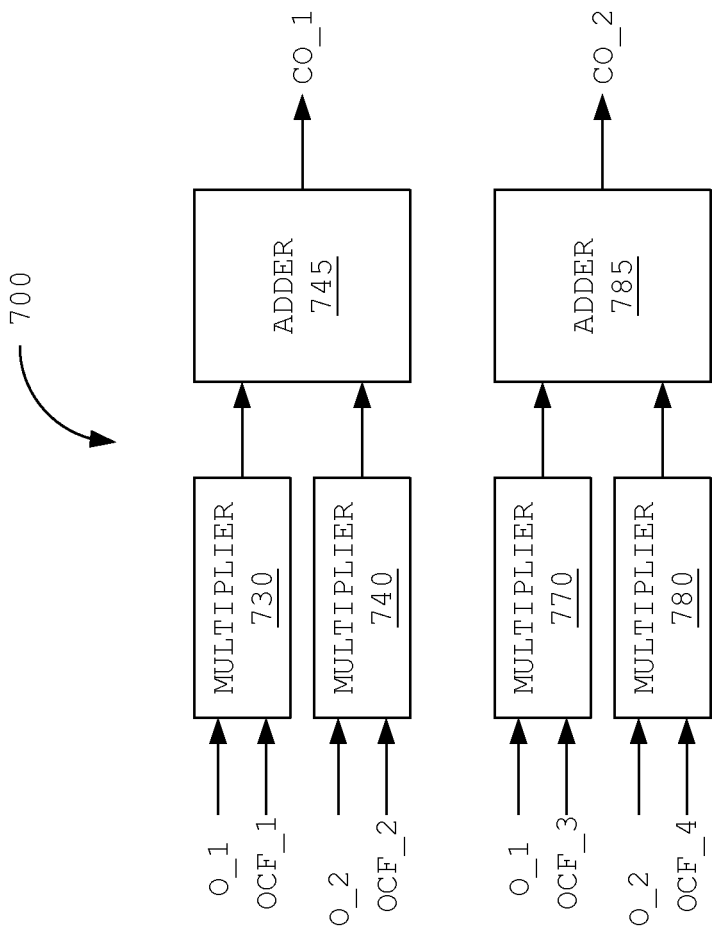
FIG. 7 a simplified block diagram of an output combination unit in accordance with one embodiment of the present invention.

FIG. 7 is a block diagram of an output combination unit 270, which can be used for output combination unit 270 in FIG. 2. Output combination unit 700 includes multipliers 730, 740, 770, and 780 and adders 745 and 785. Specifically, multipliers 730 and 740 receive output values O_1 and O_2, and output combination factors OCF_1 and OCF_2, respectively. Multiplier 730 calculates the product of output value O_1 and output combination factor OCF_1. Multiplier 740 calculates the product of output value O_2 and output combination factor OCF_2. The products calculated by multipliers 730 and 740 are provided to adder 745, which calculates combined output value CO_1 as the sum of the products provided by multipliers 730, and 740. Thus, in the embodiment of FIG. 7, combined output value CO_1 is equal to output value O_1 multiplied by output combination factor OCF_1 plus output value O_2 multiplied by output combination factor OCF_2.

Multipliers 770 and 780 receive output values O_1 and O_2, and output combination factors OCF_3 and OCF_4, respectively. Multiplier 770 calculates the product of output value O_1 and output combination factor OCF_3. Multiplier 780 calculates the product of output value O_2 and output combination factor OCF_4. The products calculated by multipliers 770 and 780 are provided to adder 785, which calculates combined output value CO_2 as the sum of the products provided by multipliers 740, and 750. Thus, in the embodiment of FIG. 7, combined output value CO_2 is equal to output value O_1 multiplied by output combination factor OCF_3 plus output value O_2 multiplied by output combination factor OCF_4. The specific choices of output combination factors in part determines the behavior of multi-input IIR filter 200.

As illustrated in FIGS. 2-7, multi-input IIR filter 200 uses a large number of multipliers. Because general purpose multipliers are expensive to implement, some embodiments of the present invention may use well known techniques to limit the complexity of the multipliers. For example, some embodiments of the present invention may limit the choices available for the various factors in the multiplications to simplify the multiplication process. For example, by choosing factors that are powers of two, multiplication can be accomplished using bit shifting. Furthermore, some embodiments of the present invention may restrict the choices for multiplication factors that multipliers can be implemented using lookup tables and/or barrel shifters.

In the various embodiments of the present invention, novel methods and systems have been described for IIR filters. By using multiple input values simultaneously, IIR filters in accordance with the present invention can achieve much higher throughput than conventional IIR filters. Furthermore, multi-variable error feedback in accordance with another embodiment of the present invention can be used to increase the accuracy of the multi-input IIR filter. The various embodiments of the structures and methods of this invention that are described above are illustrative only of the principles of this invention and are not intended to limit the scope of the invention to the particular embodiments described. For example, in view of this disclosure those skilled in the art can define other IIR filters, multi-input IIR filters, input combination units, output combination units, multi-variable error feedback units, multi-variable feedback units, quantizers, delay units, and so forth, and use these alternative features to create a method, or system according to the principles of this invention. Thus, the invention is limited only by the following claims.

What is claimed is:

1. A multi-input Infinite Impulse Response (IIR) filter configured to receive a plurality of input values from an input signal and to generate a plurality of output values for an output signal at each iteration, comprising:
    a primary input combination unit configured to receive the plurality of input values and configured to generate a first combined input value and a second combined input value;
    a first adder coupled to receive the first combined input value, a first primary feedback value, and a first error feedback value, and configured to generate a first output value;
    a first quantizer coupled to receive the first output value and configured to generate a first quantized output value;
    a first delay unit coupled to receive the first quantized output value and configured to generate a first delayed quantized output value;
    a second adder coupled to receive the second combined input value a second primary feedback value, and a second error feedback value, and configured to generate a second output value;
    a second quantizer coupled to receive the second output value and configured to generate a second quantized output value;
    a second delay unit coupled to receive the second quantized output value and configured to generate a second delayed quantized output value;
    a multi-variable feedback unit coupled to receive the first delayed quantized output value and the second delayed quantized output value and configured to generate the first primary feedback value and the second primary feedback value; and
    a multi-variable error feedback unit coupled to receive the first output value, the first quantized output value, the second output value, and the second quantized output value and configured to generate the first error feedback value and the second error feedback value.

2. The multi-input IIR filter of claim 1, wherein the first output value is equal to a sum of the first combined input value, the first error feedback value, and the first primary feedback value, and the second output value is equal to another sum of the second combined input value, the second error feedback value, and the second primary feedback value.

3. The multi-input IIR filter of claim 1,
    wherein the first combined input value is a sum of products between the plurality of input values and a first plurality of input combination factors; and
    the second combined input value is another sum of products between the plurality of input values and a second plurality of input combination factors.

4. The multi-input IIR filter of claim 3,
    wherein the first combined input value is equal to a first input value multiplied by a first input combination factor plus a second input value multiplied by a second input combination factor plus a third input value multiplied by a third input combination factor plus a fourth input value multiplied by a fourth input combination factor; and
    the second combined input value is equal to the first input value multiplied by a fifth input combination factor plus the second input value multiplied by a sixth input combination factor plus the third input value multiplied by a seventh combination factor plus the fourth input value multiplied by an eighth input combination factor.

5. The multi-input IIR filter of claim 1,
    wherein the first primary feedback value is equal to the first delayed quantized output value multiplied by a first primary feedback factor plus the second delayed quantized output value multiplied by a second primary feedback factor; and
    the second primary feedback value is equal to the first delayed quantized output value multiplied by a third primary feedback factor plus the second delayed quantized output value multiplied by a fourth primary feedback factor.

6. The multi-input IIR filter of claim 1, wherein the multi-variable error feedback unit further comprises:
    a first subtractor coupled to receive the first output value and the first quantized output value and configured to generate a first error value;
    a third quantizer coupled to receive the first error value and configured to generate a first quantized error value;
    a third delay unit coupled to receive the first quantized error value and configured to generate a first delayed quantized error value;
    a second subtractor coupled to receive the second output value and the second quantized output value and configured to generate a second error value;
    a fourth quantizer coupled to receive the second error value and configured to generate a second quantized error value; and
    a fourth delay unit coupled to receive the second quantized error value and configured to generate a second delayed quantized error value.

7. The multi-input IIR filter of claim 6,
    wherein the first error feedback value is equal to the first delayed quantized error value multiplied by a first error feedback factor plus second delayed quantized error value multiplied by a second error feedback factor; and
    the second error feedback value is equal to the first delayed quantized error value multiplied by a third error feedback factor plus the second delayed quantized error value multiplied by a fourth error feedback factor.

8. The multi-input IIR filter of claim 6, wherein the multi-variable error feedback unit further comprises:
    a first multiplier coupled to receive the first delayed quantized error value and a first error feedback factor and configured to output a first error product;
    a second multiplier coupled to receive the second delayed quantized error value and a second error feedback factor and configured to output a second error product;
    a third adder coupled to receive the first error product and the second error product and configured to generate the first error feedback value;
    a third multiplier coupled to receive the first delayed quantized error value and a third error feedback factor and configured to output a third error product;
    a fourth multiplier coupled to receive the second delayed quantized error value and a fourth error feedback factor and configured to output a fourth error product; and
    a fourth adder coupled to receive the third error product and the fourth error product and configured to generate the second error feedback value.

9. The multi-input IIR filter of claim 6, wherein the multi-variable error feedback unit further comprises a second multi variable error feedback unit coupled to receive the first error value, the first quantized error value, the second error value, and the second quantized error value and configured to generate a first secondary error feedback value and a second secondary error feedback value.

10. The multi-input IIR filter of claim 9,
wherein the first adder is coupled to receive the first secondary error feedback value; and
the second adder is coupled to receive the second secondary error feedback value.

11. The multi-input IIR filter of claim 1, further comprising:
a secondary input combination unit coupled to receive a subset of the plurality of input values and configured to generate a third combined input value and a fourth combined input value;
a third delay unit coupled to receive the first output value and configured to generate a first delayed output value;
a fourth delay unit coupled to receive the second output value and configured to generate a second delayed output value;
an output combination unit coupled to receive the first delayed output value and the second delayed output value and configured to generate a first combined output value and a second combined output value;
a third adder coupled to receive the first combined output value and the third combined input value and to generate a third output value; and
a fourth adder coupled to receive the second combined output value and the fourth combined input value and configured to generate a fourth output value.

12. The multi-input IIR filter of claim 11,
wherein the third combined input value is equal to a third input value multiplied by a first input combination factor plus a fourth input value multiplied by a second input combination factor; and
the fourth combined input value is equal to the third input value multiplied by a fifth input combination factor plus the fourth input value multiplied by a sixth input combination factor.

13. The multi-input IIR filter of claim 11,
wherein the first combined output value is equal to the first output value multiplied by a first output combination factor plus the second output value multiplied by a second output combination factor; and
the second combined output value is equal to the first output value multiplied by a third output combination factor plus the second output value multiplied by a fourth output combination factor.

* * * * *